United States Patent [19]

Cederberg et al.

[11] Patent Number: 4,656,114

[45] Date of Patent: Apr. 7, 1987

[54] PRESENSITIZED COLOR-PROOFING DIAZO RESIN SHEET WITH ACRYLIC THERMAL ADHESIVE LAYER

[75] Inventors: Barbara M. Cederberg, St. Paul; Arlene K. Musser, Oakdale, both of Minn.

[73] Assignee: Minnesota Mining and Manufacturing Company, St. Paul, Minn.

[21] Appl. No.: 764,246

[22] Filed: Aug. 9, 1985

Related U.S. Application Data

[63] Continuation-in-part of Ser. No. 619,000, Jun. 11, 1984, abandoned.

[51] Int. Cl.[4] .................. G03C 1/90; G03C 1/76; G03C 7/00; G03C 11/12
[52] U.S. Cl. .................. 430/160; 430/143; 430/157; 430/158; 430/162; 430/257; 430/259; 430/263; 430/293
[58] Field of Search .................. 430/143, 158, 160, 162, 430/257, 259, 263, 293

[56] References Cited

U.S. PATENT DOCUMENTS

| | | | |
|---|---|---|---|
| 3,136,637 | 6/1964 | Larson | 96/75 |
| 3,671,236 | 6/1972 | Van Beusekom | 96/15 |
| 4,260,673 | 4/1981 | Krech | 430/143 |
| 4,366,223 | 12/1982 | Larson | 430/143 |

Primary Examiner—Charles L. Bowers, Jr.
Attorney, Agent, or Firm—Donald M. Sell; James A. Smith; Mark A. Litman

[57] ABSTRACT

A light-sensitive color proofing sheet is described for producing an image on various substrates. A light-sensitive continuous color layer is releasably attached to a carrier. Overlying the color layer is a water-insoluble transparent colorless barrier layer. On the opposite surface of the barrier layer is a thermally laminable adhesive layer. Upon lamination of the sheet to a substrate, removal of the carrier and exposure to actinic radiation, the color layer is formed into an image, photomechanically, by removal of the non-image areas.

22 Claims, No Drawings

PRESENSITIZED COLOR-PROOFING DIAZO RESIN SHEET WITH ACRYLIC THERMAL ADHESIVE LAYER

This is a continuation-in-part of application Ser. No. 619,000, filed June 11, 1984, now abandoned.

BACKGROUND OF THE INVENTION

1. Field of the Invention

The present invention relates to the photomechanical production of multi-color images on a single sheet or substrate without printing. The invention has particular application in the proofing of color separation negatives preparatory to multi-color lithographic reproduction.

2. Description of the Prior Art

In printing pictoral matter, whether by lithography, letterpress or gravure, the half tone process is used, wherein the actual printing image is composed of thousands of minute dots per square inch of a single color ink of varied dot size or ink density. What the naked eye sees as shading in half tone prints is actually controlled variation in the size of dots relative to the unprinted areas between the dots. In black and white pictorial matter the dots are printed in black ink only. Full color reproductions, however, are necessarily printed in each of at least three colors, cyan, magenta, and yellow (known as "three color process"), or in these same colors with the addition of black ("four color process"). For each color a printing plate is made. In order to make the three or four printing plates, the original color picture or photograph is "separated" photographically, with the use of filters, masks, etc., into a set of three or four half-tone negatives, each representing one of the colors, and containing, dot for dot, the amount of that color which must be printed to produce the desired total color print. The preparation of the color-separation negative is an art and requires considerable skill in handling the many variables to produce a desired result. Often trial and error is involved requiring correction or replacement of one or more of the negatives. Unless some reliable system is available to "proof" the negatives, the printing press must be set up and copy printed just to secure preliminary proofs. This is time consuming and expensive. It is therefore desireable to provide accurate means for proofing the negatives without printing.

One system for proofing color separation negatives is disclosed in U.S. Pat. No. 3,136,637. A light-sensitive transparent sheet is provided for each of the colors to be printed. Each of the sheets is exposed through its respective color separation negative. Upon processing, the color in the non-image areas is removed, yielding a sheet which contains the desired color pattern in the image areas, while being colorless and transparent in the non-image areas (e.g. between halftone dots). After each of the separate sheets is made, they are assembled together in registry on a white background, whereupon a color proof results.

That system of color proofing has a number of inherent drawbacks. For example, the laying up of the multiplicity of sheets requires that the viewer look through a plurality (three or four) of transparent films during the proofing operation. Since the composite is made of several separate sheets, extreme care is required to maintain registry. If the individual sheets are not perfectly colorless and transparent in the optical sense, any "haze" or imperfection present is multiplied in the several sheets. Additionally, incident light reflects from the several sheets imparting a gloss which is not truly representative of printed copy, thus introducing a need for interpretation in evaluating the proof.

U.S. Pat. No. 3,671,236 improves upon the proofing system described in U.S. Pat. No. 3,136,637. Photomechanically produced images corresponding with each color are integrally built up on a single substrate (much as occurs in the actual printing operation itself) without any printing operations. The multiplicity of carrier films is eliminated by transferring individual color images from a sheet comprised of (1) a carrier with release surface, (2) pigment and binder layer, (3) photohardenable or insolubilizable layer, (4) barrier layer and (5) pressure-sensitive adhesive layer.

BRIEF DESCRIPTION OF THE INVENTION

The present invention relates to a photosensitive article particularly useful in the generation of photomechanical proofs which comprises a carrier with a release surface, a pigment and binder layer, a photohardenable layer, an organic polymeric solvent soluble barrier layer, and a thermally laminable adhesive layer.

DETAILED DESCRIPTION OF THE INVENTION

The use of a thermally laminable adhesive layer rather than a pressure-sensitive adhesive layer offers the opportunity for some advantages. A thermally adhesive layer can be positioned and repositioned (before lamination) without a chance of altering the receptor surface or picking up extraneous matter can occur with pressure-sensitive adhesive layers. The physical nature of the smooth, transparent and optically clear thermally laminable adhesive layer offers better optical qualities than the less physically smooth pressure-sensitive adhesive layer.

In attempting to substitute a thermally laminable adhesive layer for the pressure-sensitive adhesive layer of U.S. Pat. No. 3,671,236, significant problems were encountered. Amongst the problems encountered were (1) yellowing of the adhesive layer when exposed to actinic radiation, particularly ultraviolet radiation, during imaging of the proof, (2) self-lamination of thermal adhesive during storage at 45° C. and 2 grams/cm$^2$ pressure, (3) excessive laminating temperatures which deteriorated the sensitometric properties of the photohardenable layer, (4) and ingredients in the thermal adhesive layer that were fugitive and migrated through the barrier layer to disturb the sensitometry of the photohardenable layer, the color of the pigment containing layer and the optical properties of other layers. Many adhesives also would not adhere to the receptor sheet or the barrier layer.

It has been found critical to the use of the thermally laminable adhesive layer in the photo-mechanical proofing article of the present invention that the following properties be provided by the thermal adhesive layer:

(1) the adhesive layer be thermally laminable at a temperature between 100° and 150° C. at a pressure of 1.6 lb/in$^2$ (0.29 kg/cm$^2$), (2) the adhesive layer is non-tacky at room temperature or preferably not laminable to paper or shelf-laminable at 45° C., 2 g/cm$^2$, for at least one week, (3) will not discolor or alter its optical density by more than 0.05 optical density units when an area of 15,000 cm$^2$ is exposed to a 5 kilowatt source of ultraviolet radiation having a majority of the radiation distributed over the range of 350 and 450 nm, at a distance of 1 meter for 2 minutes, and (4) have no ingredients which by themselves or in combination with the solvent of the adhesive layer migrate across the barrier layer and desensitize the photohardenable layer, alter the color or tone of the pigments, or alter the optical qualities of the barrier or photosensitive layer.

The adhesive layer must also strongly adhere to the barrier layer, the bond strength between those layers exceeding the mild bond strength between the release layer and either the pigment containing binder layer or the carrier layer.

The property described above for non-coloration reflects conditions of conventional imagewise exposure for the article. Thus the element should not discolor or alter its optical density by as much as 0.05 optical density units (at any wavelength) when subjected to the conventional levels of exposure required to image the diazo resin. Exposure at 417 nm is conventional in industry at present (that is, an exposing radiation having a peak output at about 417 nm), but any other wavelength for maximum output is acceptable. The sheet should not discolor when exposed to sufficient radiation to enable an image to be developed from activation of the diazo resin.

The construction according to the present invention would typically comprise a carrier sheet provided with a release surface, which may either be a smooth surface of the carrier itself, or a surface coating thereon. Overlying the surface and in intimate clinging engagement therewith, but not adhesively bonded thereto, is a color coating comprising, for example, a pigmented organophilic water-insoluble solvent-softenable resinous polymer. Coated over and in contact with the color-coating is a light-sensitive diazo resin layer. The color coating and light-sensitive layer are intimately associated and adherently bonded together (and in certain constructions can actually be combined to a single layer). The light-sensitive layer is soluble in a solution which softens and/or partially dissolves the color coating.

Overlying the light-sensitive layer is a continuous solvent-resistant resinous protective film or barrier layer. To the exposed surface of the barrier layer is applied a layer of thermally laminable adhesive. Preferably the adhesive layer is from $0.1 \times 10^{-4}$ cm to $20 \times 10^{-4}$ cm in thickness. The outer surface of the adhesive can optionally be protected from contamination by dirt or grease, by a protective release liner.

In applying that structure to a substrate, such as white paper, the protective liner is first stripped from the adhesive surface and the entire structure is laminated for example, by heated rolling, onto the substrate. Thereafter, the carrier sheet is stripped from the structure, the bond to the paper and the adhesion between the several layers being greater than the non-adhesive clinging engagement between the carrier sheet and the color coating or the release layer. Following the removal of the carrier, the remaining structure, now bonded to the substrate, is exposed to ultraviolet light through the appropriate color separation negative corresponding with the color of the particular coating. In the light struck areas, the ultraviolet light passes through the color coating (which is transparent thereto) and exposes and insolubilizes the light-sensitive material. A firm bond between the light reacted material and the under- and over-lapping coatings occurs. Adjacent unexposed areas remain light-sensitive.

Thereafter the sheet is processed with processing solvent selected with respect to the particular material of which the color coating layer is composed (and which contains a solvent for the unexposed diazo), to develop the image. The color coating and the sensitizer in the non-light struck areas is removed, leaving the color image anchored to the underlying barrier layer by the light-reacted diazo in exposed areas. During processing, the barrier layer serves as a barrier which protects the substrate (and adhesive) from solutions used during the processing.

The adhesive system of the present invention has been found to be limited to a narrow class of available thermal adhesives. Only acrylate polymer and copolymer thermal adhesives with a laminating temperature of 100° to 150° C. at a pressure of 0.29 kg/cm$^2$ for 5–10 second have been found to fulfill all requirements of the present invention. Polymers of n-butyl acrylate, ethyl acrylate, isopropyl acrylate and their copolymers with ethylenically unsaturated monomers such as other acrylates, acrylic anhydride, acrylic acid, methacrylic acid, styrene, vinyl acetate, and the like are the only adhesives that fulfill all essential requirements of the present invention. Monomers which cause yellowing or discoloring of the final adhesive composition when a sheet (e.g., 15,000 cm$^2$) is exposed to a source of 5 kw ultraviolet radiation having a peak at about 417 nm at 1 meter for two minutes must be avoided. Any change in the optical density of 0.1 and even 0.05 is considered intolerable discoloration. Copolymerizable ethylenically unsaturated materials such as acrylonitrile, vinylidene chloride, and vinyl chloride tend to cause yellowing and must be used, if used at all in amount less than 10% and preferably less than 5% of the total dry weight of components in the adhesive. Prefered compositions include poly(n-butyl acrylate/ethyl acrylate) (60/40), poly(ethyl acrylate/styrene) (64/36), poly(n-butylacrylate), poly(styrene/n-butylacrylate/acrylic acid/acrylonitrile) (45/45/8/2), and poly(n-butyl acrylate/vinyl acetate) (80/20). Vinyl acetate and acrylic monomer copolymers are known in the polymer industry as vinyl acrylates.

Many other thermal adhesive systems were attempted, but all others failed for various reasons.

Following the above described photomechanical production of the first color image on the substrate, for example cyan (blue), similar sheets but containing the yellow, magenta and black color coatings are successively applied to yield a four color proof.

These and other aspects of the invention will now be illustrated in the following non-limiting examples:

EXAMPLES 1–13

A 2-mil film of smooth-surfaced biaxially oriented polyethylene terephthalate polyester is first coated with a polyvinyl alcohol solution constituted as follows:

|  | Parts by wt. |
| --- | --- |
| Polyvinyl alcohol (available commercially as Gelvatol 20-30/Gelvatol 20:90 (3/1)) | 2.5 |
| Glycerin | 0.5 |
| Water | 97 |

A dry coating weight of 75 mg./ft.$^2$ provides a satisfactory release layer. The release layer surface is oven dried and then overcoated with a resin solution containing a suitable transparent pigment, in this instance a phthalocyanine pigment, e.g. "Monastral Blue BT 284-D."

The coating solution is prepared by first dispersing the pigment into 1,1,2-trichloroethane solvent, and adding polyvinylformal resin (Formvar 15/95 E), the amount of the ingredients being adjustable to yield a mix having 65 parts resin, 35 parts pigment, and 900 parts solvent. This mix is approximately milled. The resultant mill base is then diluted by adding further solvent to yield approximately a 3 percent solids. This pigmented-resin coating solution or dispersion is applied over the dried release layer at a dry coating weight of about 20–70 milligrams per square foot. The dry coating weight of 160 mg./ft.$^2$ (generally a coating weight of 100–400 mg/ft$^2$ is preferred).

A clear colorless thermally laminable adhesive is coated on the acrylate surface at a dry coating weight of 800 mg./ft.$^2$. Following drying, a protective liner of polyethylene coated paper is not necessary but may be placed against the adhesive to facilitate handling of the sheet and to protect the adhesive from dirt, etc. In this form the light-sensitive sheet can then be converted into standard sizes, packed in suitable light-proof containers and shipped in commerce. The adhesive may be coated in much greater quantities, a general range being from about 100 to 1200 mg./ft.$^2$.

The following resins were tried as the thermal laminating adhesive with two different laminating temperatures used (110° and 140° C.) with the results indicated in the table:

| Example | Adhesive | Comments/Results |
|---|---|---|
| 1. | Poly(n-butyl acrylate) | A clear faithful proof rendition |
| 2. | Poly(n-butylacrylate/ethylacrylate) (60/40) | A clear faithful proof rendition |
| 3. | Poly(styrene/ethylacrylate) (36/64) | A clear faithful proof rendition |
| 4. | Poly(styrene/ethylacrylate) (54/46) | A clear faithful proof rendition |
| 5. | Poly(n-butylacrylate/styrene/acrylic acid/acrylonitrile) (45/45/8/2) | A clear faithful proof rendition |
| 6. | Poly(n-butylacrylate/vinylacetate) (80/20) | A clear faithful proof rendition |
| 7. | Poly(vinyl acetate) | Image was distorted |
| 8. | Poly(styrene/butadiene) (90/10) | Adhesive clouded and yellowed |
| 9. | Poly(vinylidene chloride) | Film delaminated from receptor after development |
| 10 | Poly(vinyl chloride) | Changed color hue of pigment, yellowed, mottled pattern in solid color areas |
| 11. | Poly(carboxylated styrene/butadiene) (70/30) | Would not adhere to barrier, yellowed |
| 12. | Poly(vinylacetate/vinyl chloride/vinyl alcohol) | Poor adhesion to receptor, yellowed |
| 13. | Poly(vinylacrylate) | Yellowed in one instance, but acceptable in four other examples | coated sheet construction is oven dried as before to evaporate the solvent.

The polyvinyl formal coated side of the sheet is then primed by a corona discharge treatment, sufficient to render the surface of the film water-wettable.

A solution of a light-sensitive diazo resin or equivalent is then coated over the primed surface of the sheet. A preferred diazo resin is the condensation product of p-diazodiphenylamine and formaldehyde, prepared, for example, in accordance with the method described in U.S. Pat. No. 2,714,066. A solution of the pure diazo resin, for example, 4 parts resin dissolved in 48 parts water and 12 parts methanol, is made up.

The preparations of the light-sensitive diazo resin are carried out under subdued light, for example, under a yellow light. This is also true of the other operations involving the coating of the sheet with the light-sensitive resin and subsequent handling of the sensitized sheet prior to exposure and development.

The solution of the light-sensitive diazo resin just described may be applied over the primed polyvinylformal layer by roll-coating or by dipping the sheet into the solution of the resin. It is preferred that the diazo coating be thin, a residue of about 6–8 milligrams of the diazo resin per square foot of the area being satisfactory, although the precise amount is not particularly critical with amounts of 3–50 mg./ft.$^2$ being useful. The sheet is then air dried at room temperature, or at slightly elevated temperatures if desired. A barrier is applied over the diazo layer, for example, by coating a two percent weight solution in methyl ethyl ketone of a 3:1 weight ratio of poly acrylate ("Elvacite 2044") and a polyvinyl chloride-acetate copolymer ("Vinylite VAGH") at a As can be seen from the data, only thermally laminable acrylate polymers and copolymers performed satisfactory in the practice of the present invention. The one example where a vinylacrylate yellowed appeared to be a reaction between the acrylate and a surfactant. A different formulation with the acrylate corrected the problem.

In the foregoing illustration, a cyan color proofing sheet is described. The companion magenta, yellow and black structures (which, together with the cyan sheet, constitute a complete four-color proofing system) are similarly prepared employing the same polyvinylformal resin coating, but incorporating appropriately colored pigments, for example, "Watchung Red RT 761-D," "Benzidine Yellow YT 564-D," and Cabot "Regal 300 R" carbon black. Pigments are selected and pigment/resin ratios established generally to provide the same color-density as would result from the printing ink of corresponding color being used on the job being proofed. The sheets can be stored in sensitized condition, and then used weeks or months later as successfully as immediately following manufacture. In using the sheets in producing a color proof composite, any desired substrate can be used.

In preparing a color proof composite, the colors are processed individually and consecutively. A sheet of the color represented by the first negative to be proofed, for example yellow is prepared for processing by removing the adhesive protective sheet and laminating the color sheet to the backing sheet. Pressure applied by conventional laminating apparatus with a heated roller is sufficient to achieve lamination through the thermally laminable adhesive. Following lamination the support sheet of polyethylene terephthalate is stripped away. The light sensitive layer now on the backing sheet is contact exposed through the corresponding color separation negative.

The light-imaged backing is then physically developed with a solution of normal propanol-water in a 1:1 volume ratio, brushing and wiping with a soft cloth pad to remove the pigmented resin and unexposed sensitizer layers from the non-image (unexposed) areas to leave the latter clear and colorless. Thereby an image is defined, faithfully representing the reproduction and full color range which would result if the complete plate-making and printing operation (using appropriately matched ink), were carried through with that color separation negative.

A sheet of the second color to be proofed, preferably magenta, is prepared in the same way by removing the adhesive protective sheet and laminating it to the yellow imaged backing sheet. The corresponding color separation negative must now be positioned in exact register with the yellow image. This is commonly provided for by a preregistration of all the separation negatives and the backing sheet by a system of register marks or punches. The light-sensitive layer now on the yellow-imaged backing sheet is exposed and processed, as for the first color. The remaining cyan and black images are thereafter added, in turn, thus faithfully reproducing the four color result which would occur in printing, were printing plates employed prepared from the same color separation negatives.

Certain necessary relationships exist between the elements of the construction just described. Adhesive relationships must be such that, after adhesive lamination to the backing sheet, the release layer will allow stripping away the carrier layer without disrupting the adhesive bond. Failure must not occur at either the adhesive-backing sheet or adhesive-barrier layer bonds. While it is not particularly critical whether release occurs between carrier-layer-release layer or release layer-color layer, release is generally less efficient between two in situ formed layers, resulting in somewhat more likely release between carrier layer and release layer. In this event, it is of importance that the release layer be transparent and soluble in the developing solution.

With regard to the selection of the resin of the color coat and to the solution used to develop the image, reference is again made to U.S. Pat. No. 3,136,637, where numerous organophilic hydrophobic water-insoluble solvent-softenable resinous polymers are disclosed, along with suitable developing solutions. It is therein discussed that upon light-exposure of the structure, a firm in situ bond is formed between the resin and the diazo in the light-struck areas, while permitting the resin to be removed upon light rubbing treatment with the appropriate developing solution. The present invention avails itself of these principles.

Inasmuch as the light-sensitive layer is extremely thin and discontinuous, the color-coat and the barrier layer contact one another in the structure and their inter-relation is important. The bond formed between them (or any intermixing occurring at the interface) must not be such as to prevent the color-coat from being removed in the non-light struck areas during development. As indicated above, whatever natural bond exists is strengthened in situ upon light reaction of the diazo to give a strong bond preventing removal in those areas upon development. It has been found that the desired relation is present where at least a degree of physical incompatability exists between the resins comprising the color and barrier layers.

During the coating operations, best results are obtained where a later applied layer is cast from a solvent which does not dissolve prior layers.

In the preceding example, the color-coating and the diazo resin were applied in separate steps from different solvents.

We claim:

1. A presensitized color-proofing sheet comprising a carrier sheet having a release surface, a continuous color coating of pigmented organophilic hydrophobic water-insoluble resinous polymer softenable and/or partially dissolvable in a solvent developing medium, said color coating being in intimate clinging engagement with but not adhesively bonded to said release surface, a light-sensitive diazo resin soluble in said solvent developing medium directly associated with said color coating, said direct association being at least one of the following:
   (a) the incorporation of said diazo resin in the color coating to form a single layer; and
   (b) the incorporation of said diazo resin in a layer separate but contiguous to the color coating layer,
a continuous, water-insoluble, transparent, colorless barrier layer bonded on one surface over said color coating and said diazo resin, said barrier layer being insoluble in said solvent developing medium, the diazo resin becoming insolubilized and firmly bonding said color layer to said barrier layer in the light-struck areas upon light exposure of said sheet, the color layer and diazo resin being readily removable from said barrier layer in areas not light exposed and over said barrier layer a thermally-laminable adhesive layer comprising a layer of at least one acrylic polymer or copolymer which is laminable at a temperature between 100° and 150° C. at a pressure of 0.29 kg/cm$^2$ in 10 seconds, non-tacky at room temperature, will not discolor or alter its optical density by as much as 0.05 optical density units when exposed to sufficient ultraviolet radiation having a majority of the radiation distributed over the range of 350 and 450 nm to enable an image to be developed from activation of the diazo resin and have no ingredients capable of migrating through said barrier layer and desensitizing said diazo resin, discoloring said pigment, or distorting the optical properties of the other layers.

2. The presensitized sheet of claim 1 wherein the coloring coating and the diazo resin are contiguous layers.

3. The presensitized sheet of claim 1 wherein the color coating and the light-sensitive diazo resin are intermixed in a single layer.

4. The presensitized sheet of claim 1 wherein said color coating comprises a pigmented polyvinyl formal resin.

5. The presensitized sheet of claim 2 wherein a release liner is bonded to said adhesive layer.

6. The presensitized sheet of claim 1 wherein said acrylic polymer or copolymer comprises poly(n-butyl acrylate) or a copolymer of n-butyl acrylate.

7. The presensitized sheet of claim 1 wherein said acrylic polymer or copolymer comprises poly(ethyl acrylate) or a copolymer of ethyl acrylate.

8. The presensitized sheet of claim 2 wherein said acrylic polymer or copolymer comprises poly(n-butyl acrylate) or a copolymer of n-butyl acrylate.

9. The presensitized sheet of claim 3 wherein said acrylic polymer or copolymer comprises poly(n-butyl acrylate) or a copolymer of n-butyl acrylate.

10. The presensitized sheet of claim 4 wherein said acrylic polymer or copolymer comprises poly(n-butyl acrylate) or a copolymer of n-butyl acrylate.

11. The presensitized sheet of claim 2 wherein said acrylic polymer or copolymer comprises poly(ethyl acrylate) or a copolymer of ethyl acrylate.

12. The presensitized sheet of claim 3 wherein said acrylic polymer or copolymer comprises poly(ethyl acrylate) or a copolymer of ethyl acrylate.

13. The presensitized sheet of claim 4 wherein said acrylic polymer or copolymer comprises poly(ethyl acrylate) or a copolymer of ethyl acrylate.

14. The presensitized sheet of claim 1 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

15. The presensitized sheet of claim 2 wherein said thermal adhesive comprises a copolymer derived from at least one acrylate selected from the group consisting of a n-butyl acrylate and ethyl acrylate and at least ethylenically unsaturated monomer selected from the group consisting of styrene, acrylic acid, methacrylic acid, acrylic anhydride, and vinyl acetate.

16. The presensitized sheet of claim 3 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

17. The presensitized sheet of claim 4 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

18. The presensitized sheet of claim 5 wherein said thermal adhesive comprises a copolymer derived from at least one acrylate selected from the group consisting of n-butyl acrylate and ethyl acrylate and at least ethylenically unsaturated monomer selected from the group consisting of styrene, acrylic acid, methacrylic acid, acrylic anhydride, and vinyl acetate.

19. A presensitized color-proofing sheet comprising a carrier sheet having a release surface, a continuous color coating of pigmented organophilic hydrophobic water-insoluble resinous polymer softenable and/or partially dissolvable in a solvent developing medium, said color coating being in intimate clinging engagement with but not adhesively bonded to said release surface, a light-sensitive diazo resin soluble in said solvent developing medium directly associated with said color coating, said direct association being at least one of the following:
(a) the incorporation of said diazo resin in the color coating to form a single layer; and
(b) the incorporation of said diazo resin in a layer separate but contiguous to the color coating layer,
a continuous, water-insoluble, transparent, colorless barrier layer bonded on one surface over said color coating and said diazo resin, said barrier layer being insoluble in said solvent developing medium, the diazo resin becoming insolubilized and firmly bonding said color layer to said barrier layer in the light-struck areas upon light exposure of said sheet, the color layer and diazo resin being readily removable from said barrier layer in areas not light exposed and over said barrier layer a thermally-laminable adhesive layer consisting essentially of a layer of at least one acrylic polymer or copolymer which is laminable at a temperature between 100° and 150° at a pressure of 0.29 kg/cm$^2$ in 10 seconds, non-tacky at room temperature, will not discolor or alter its optical density by as much as 0.05 optical density units when an area of 15,000 cm$^2$ is exposed to 5 kilowatts of ultraviolet radiation having a majority of the radiation distributed over the range of 350 and 450 nm at a distance of 1 meter for 2 minutes, and have no ingredients capable of migrating through said barrier layer and desensitizing said diazo resin, discoloring said pigment, or distorting the optical properties of the other layers.

20. The presensitized sheet of claim 19 wherein said polymer or copolymer comprises poly(n-butyl acrylate) or a copolymer thereof, poly(ethyl acrylate) or a copolymer thereof and ethylenically unsaturated comonomers or selected from the group consisting of styrene, acrylic acid, methacrylic acid, acrylic anhydride, and vinyl acetate.

21. The presensitized sheet of claim 19 wherein the coloring sheet and the diazo resin are contiguous layers.

22. The presensitized sheet of claim 19 wherein the color coating and the light-sensitive diazo resin are intermixed in a single layer.

* * * * *